United States Patent [19]

Huang et al.

[11] Patent Number: 5,451,902
[45] Date of Patent: Sep. 19, 1995

[54] FULLY DIFFERENTIAL CMOS TRANSCONDUCTANCE-TRANSIMPEDANCE WIDE-BAND AMPLIFIER

[75] Inventors: Po-Chiun Huang; Chorng-Kuang Wang, both of Taipei; Wen-Chi Wu, Taoyuan; Yuh-Diahn Wang, Hsinchu, all of Taiwan

[73] Assignee: Industrial Technology Research Institute, Hsinchu, Taiwan

[21] Appl. No.: 138,240

[22] Filed: Oct. 18, 1993

[51] Int. Cl.[6] .......................... H03F 3/45; H03F 3/16; H03F 3/68
[52] U.S. Cl. ....................................... 330/253; 330/310
[58] Field of Search ............... 330/253, 254, 261, 296, 330/305, 308, 310

[56] References Cited

U.S. PATENT DOCUMENTS 4,794,349 12/1988 Senderowicz et al. ............. 330/253

OTHER PUBLICATIONS

J. Mataya, G. Haines & S. Marshall, "IF Amplifier Using $C_c$ Compensated Transistors," *I.E.E.E. J. of Solid State Circuits*, vol. SC-3, No. 4, pp. 401–407, Dec., 1968.
M. Ohara, Y. Akazawa, N. Ishihara & S. Konaka, "Bipolar Monolithic Amplifiers for a Gigabit Optical Repeater," *I.E.E.E. J. of Solid State Circuits*, vol. SC-19, No. 4, pp. 491–496, Aug., 1984.
R. Meyer & R. Blauschild, "A Wide-Band Low-Noise Monolithic Trans-impedance Amplifier", *I.E.E.E. J. of Solid State Circuits*, vol. SC-21, No. 4, pp. 530–533, Aug., 1986.
K. Toh, R. Meyer, D. Soo, G. Chin & A. Voshchenkov, "Wide–Band, Low–Noise, Matched Impedance Amplifiers in Submicrometer MOS Technology," *I.E.E.E. J. of Solid State Circuits*, vol. SC-22, No. 6, pp. 1031–1039, Dec., 1987.
T. Wakimoto & Y. Akazawa, "A Low–Power Wide–Band Amplifier Using a New Parasitic Capacitance Compensation Technique," *I.E.E.E. J. of Solid State Circuits*, vol. 25, No. 1, pp. 200–206, Feb., 1990.
A. Grebene, Bipolar and MOS Analog Integrated Circuit Design, Chap. 8.5, pp. 40–45 (1984).

*Primary Examiner*—Steven J. Mottola
*Attorney, Agent, or Firm*—Meltzer, Lippe, Goldstein

[57] ABSTRACT

A fully differential, wide-band transconductance-transimpedence amplifier with a tuneable gain is disclosed. The amplifier includes a transconductance stage for generating a current signal from an inputted voltage signal. The amplifier also has a current gain stage for amplifying the current signal generated by the transconductance stage. Additionally, the amplifier includes as transimpedance stage for generating an output voltage signal from the amplified current signal generated in the current gain stage.

15 Claims, 8 Drawing Sheets

FULLY DIFFERENTIAL CMOS TRANSCONDUCTANCE-TRANSIMPEDANCE WIDE-BAND AMPLIFIER

FIELD OF THE INVENTION

The present invention relates to an electronic amplifier circuit. In particular, the present invention relates to a fully differential, wide-band CMOS amplifier that has a tuneable gain.

BACKGROUND OF THE INVENTION

Wide-band amplifiers are useful electronic circuits for a variety of applications. For example, wide-band amplifiers may be used in a high speed data communications system. In an optical fiber transmission system, a wide-band amplifier may be used in a data regeneration circuit for amplifying a high frequency electrical signal generated in response to a received optical signal.

Advantageously, such wide-band amplifiers should have a high frequency range, produce as little noise as possible, and have a tuneable or programmable gain. It is also desirable that the wide-band amplifier be amendable to a high level of integration. Furthermore, it is desirable for process and thermal variations to have as little influence on the operation of the wide-band amplifiers as possible.

Process variations arise due to the finite resolution of lithography in semiconductor fabrication. For example, while a pole 1/RC produced by the paracitic capacitance of a transistor can be predicted in theory, the manufacturing tolerance is 5-10%. This tolerance makes it difficult to compensate for such poles.

Figure 1:
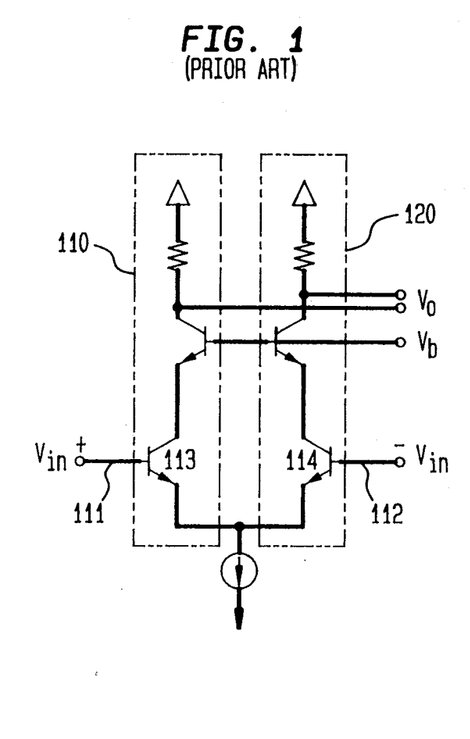
FIG. 1 depicts a prior art cascode amplifier.

FIG. 1 shows a first prior art wide-band amplifier 100 called a differential cascode amplifier. See A. Grebene, Biopolar and MOS Analog Integrated Circuit Design, Chap. 8.5, p. 40–45 (1984). As shown, two cascode stages 110, 120 are connected in a differential amplifier configuration. The input voltage Vin is applied across the terminals 111, 112. By virtue of using cascode stages 110, 120, the Miller effect (build up of base-collector capacitance in the transistors 113, 114) is reduced thereby permitting higher frequency operation. However, the frequency response of the cascode differential amplifier 100 has an additional output pole which dominates as the output resistance driven by the amplifier increases. In addition, the amplifier 100 exhibits excess phase lag when used for gain-band width optimization. Furthermore, the output swing of the amplifier 100 is reduced.

Figure 2:
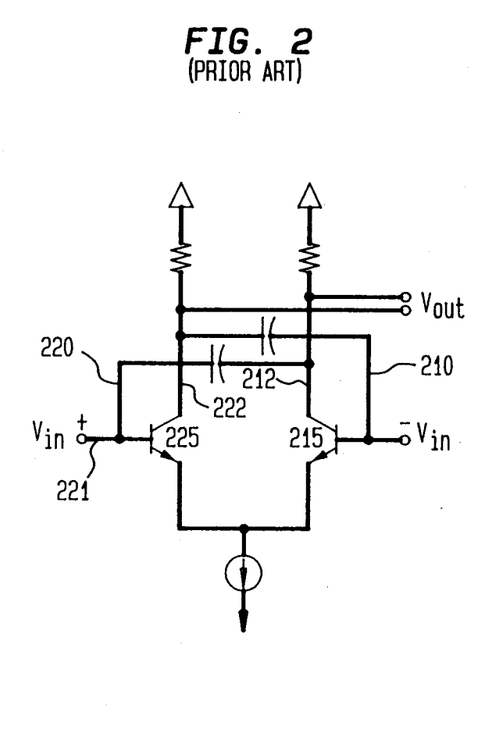
FIG. 2 depicts a prior art neutralization capacitor amplifier.

FIG. 2 shows another conventional wide-band amplifier 200 with neutralization capacitors 210, 220. See J. Mataya, G. Hanes & S. Marshall, "IF Amplifier Using $C_c$ Compensated Transistors," *I.E.E.E. J. of Solid State Circuits*, vol. SC-3, no. 4, p. 401–407, November, 1968. The capacitor 210 interconnects the base 211 of the transistor 215 with the collector 222 of the transistor 225. Likewise, the capacitor 220 interconnects the base 221 of the transistor 225 with the collector 212 of the transistor 215. The capacitance of the capacitor 210 is adjusted to be equal to the collector-base depletion capacitance of the transistor 215 and the capacitance of the capacitor 220 is adjusted to be equal to the collector-base depletion capacitance of the transistor 225. Thus, the effects of the collector-base depletion layer capacitances of the transistors 215, 225 are compensated by the antiphase transmissions of the capacitors 210, 220. Such a wide-band amplifier is disadvantageous because the capacitors 210 and 220 introduce a decreasing output pole in the frequency response of the amplifier 200. Thus, the amplifier 200 is not effective because it can't improve the bandwidth. That is, the dominant pole is now transferred to the output node and cannot be pushed away.

Figure 3:
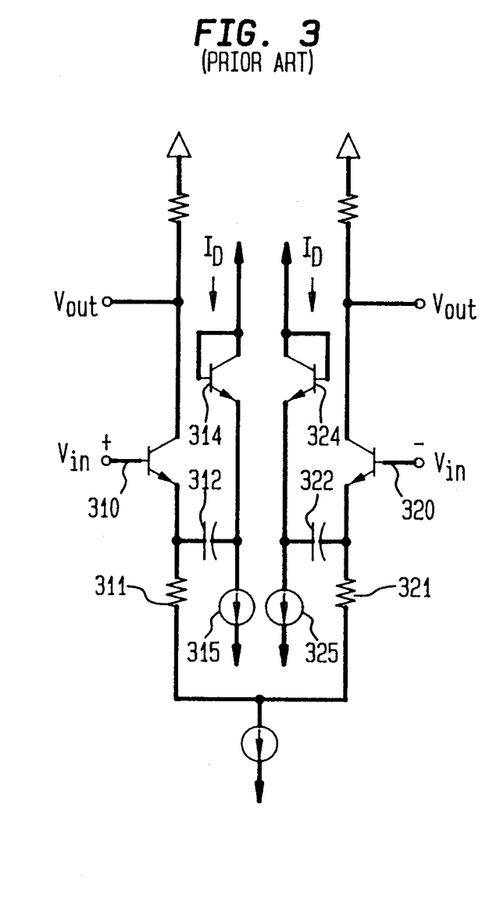
FIG. 3 depicts a prior art amplifier utilizing a peaking technique.

FIG. 3 shows a conventional wide-band amplifier 300 which utilizes a peaking technique. See M. Ohara, Y. Akazawa, N. Ishihara & S. Konaka, "Bipolar Monolithic Amplifiers for a Gigabit Optical Repeater," *I.E.E.E. J. of Solid State Circuits*, vol. SC-19, no. 4, p. 491–96, August, 1984. As shown, two transistors 310, 320 are connected in a differential configuration as before. The emitter of each transistor 310, 320 is connected via a capacitor 312 or 322 to a current mirror circuit 315 or 325, respectively. The bias current $I_D$ which flows through the transistors 314 or 324 (connected in a diode configuration) can be controlled by controlling the current mirror circuits 315, 325 thereby realizing a variable peaking function. The circuit produces an adjustable zero which depends on the capacitance and resistance of the transistors 314 or 324 (which capacitance and resistance depend on $I_D$) and the capacitance of the capacitor 312 or 322. This zero is produced in front of the pole introduced by the emitter resistance 311 or 321, the capacitor 312 or 322, and the capacitance and resistance of transistor 314 or 324, respectively.

The problem with the circuit 300 is that the capacitances and resistances of the transistors 314 and 324 are also functions of temperature and are therefore subject to thermal drift. Furthermore, process variations produce an unpredictable response in the wide-band amplifier circuit 300. In addition, the wide-band amplifier circuit 300 is not suitable for implementation in CMOS.

By far the most commonly used class of wide-band amplifiers is feedback amplifiers. In general, a wide-band feedback amplifier sacrifices gain in order to increase bandwidth. R. Meyer & R. Blauschild, "A Wide-Band Low-Noise Monolithic Transimpedance Amplifier" *I.E.E.E. J. of Solid State Circuits*, vol. SC-21, no. 4, p. 530–33, August, 1986 discloses a shunt-series feedback amplifier using bipolar junction transistors.

Figure 4:
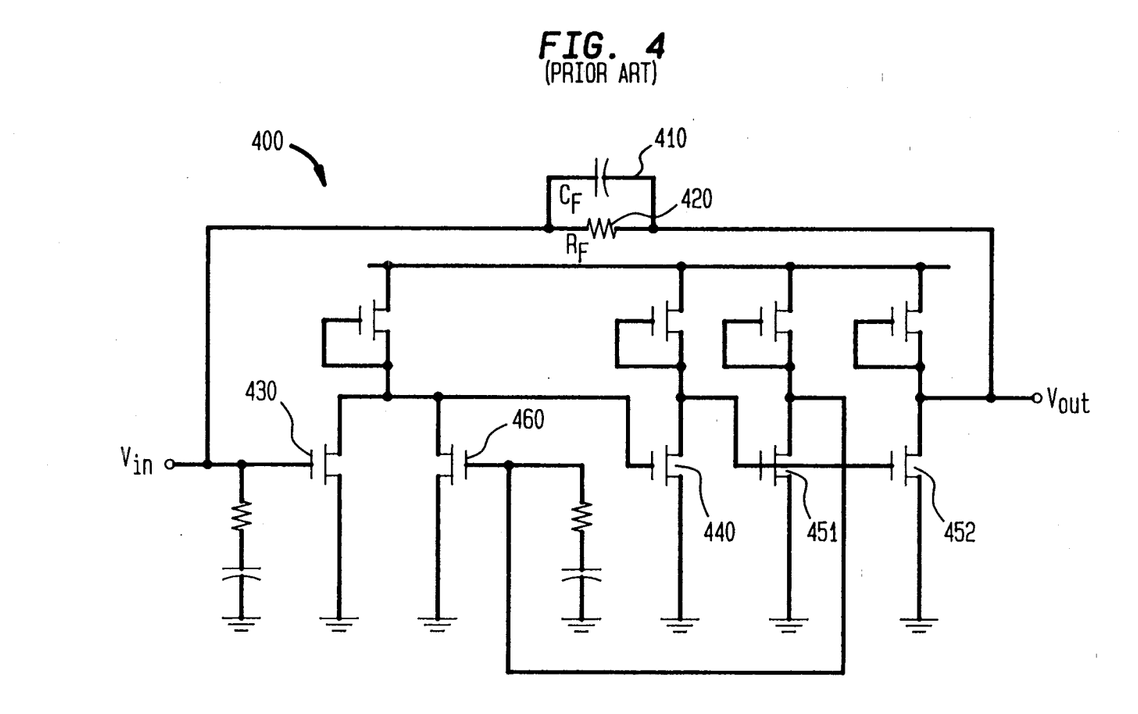
FIG. 4 depicts a prior art feedback amplifier.

FIG. 4 shows an illustrative conventional feedback amplifier 400 implemented in fine line NMOS. See K. Toh, R. Meyer, D. Soo, G. Chin & A. Voshchenkov, "Wide-Band Low-Noise, Matched Impedance Amplifiers in Submicrometer MOS Technology," *I.E.E.E. J. of Solid State Circuits*, vol. SC-22, no. 6, p. 1031–39, December, 1987. The amplifier circuit 400 is disadvantageous because in order to increase the bandwidth of the amplifier 400, a complicated multistage amplifier must be formed using an intricate S-parameter (scattering matrix parameter) analysis. For instance, the circuit 400 has transistors 430, 440 and 451–452 for amplification, transistor 460 forming an active shunt-shunt feedback circuit (from the transistor 451 to the transistor 430), and resistor 420 and capacitor 410 forming a passive feedback circuit (from the transistor 452 to the transistor 430). Furthermore, a zero is introduced in the frequency response of the amplifier 400 by the resistor 420 and capacitor 410.

Figure 5:
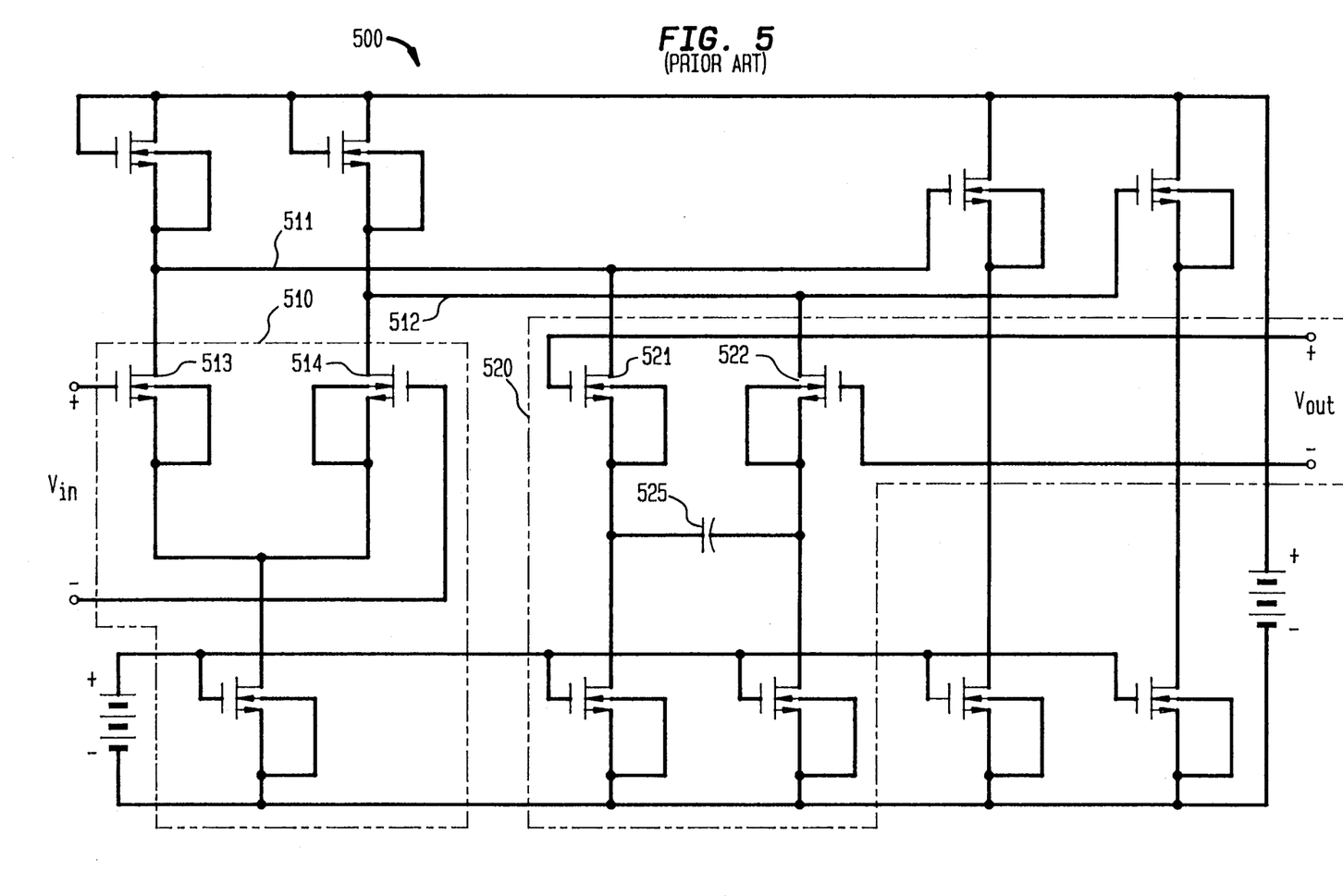
FIG. 5 depicts a prior art amplifier utilizing a parasitic capacitor compensation technique.

FIG. 5 shows yet another conventional wide-band amplifier circuit 500 utilizing a parasitic capacitance compensation technique. See T. Wakimoto & Y. Akazawa, "A Low-Power Wide-Band Amplifier Using a New Parasitic Capacitance Compensation Technique," *I.E.E.E. J. of Solid State Circuits*, vol. 25, no. 1, p. 200-206, February, 1990. As shown, the outputs 511, 512 of a differential stage 510 are connected to an output parasitic capacitance compensation stage 520. The stage 520 includes transistors 521 and 522 which detect the voltages across the parasitic junction capacitances of the transistors 513 and 514, respectively, of the differential amplifier stage 510. The transistors produce currents which charge or discharge the capacitor 525 in a way such that the capacitance of the capacitor 525 is subtracted from the junction capacitance of the transistors 513 and 514 for purposes of calculating the gain and bandwidth of the amplifier circuit 500 (thereby increasing the bandwidth of the amplifier circuit 500). However, the parasitic capacitance compensation amplifier 500 has two disadvantageous features. First, the frequency response of the amplifier 500 experiences variations in the positions of the zero. Second, the step response of the amplifier 500 exhibits a relatively longer settling time.

It is therefore an object of the present invention to overcome the disadvantages of the prior art.

SUMMARY OF THE INVENTION

This and other objects are achieved by the present invention which provides a fully differential, transconductance transimpedance wide-band amplifier which is suitable for implementation in CMOS/BiCMOS. According to one embodiment, the amplifier includes a transconductance stage for generating a current signal from an inputted voltage signal. The transconductance stage is connected to a current gain stage which amplifies the current signal generated by the transconductance stage. The current gain stage is connected to a transimpedance stage which generates an output voltage signal from the amplified current signal generated by the current gain stage.

Illustratively, the transconductance stage, the current gain stage and the transimpedance stage are all fully differential stages. Furthermore, each stage illustratively comprises transistors. In an illustrataive embodiment, only CMOS or BiCMOS type transistors are used. Illustratively, all of these transistors are signal path low impedance and have a frequency response with no zeros and with all poles at a high frequency.

The transconductance-transimpedance wide-band amplifier provides the following advantages:

(1) The amplifier can be implemented using scaled CMOS/BiCMOS technology. Thus, the amplifier is amenable to a high level of integration. Furthermore, a CMOS device provides greater reliability for process and thermal variations.

(2) The amplifier is easy to design and to adjust, e.g., an intricate S-parameter analysis is not necessary in designing the amplifier.

(3) All poles are at a high frequency.

(4) No zeros are introduced by the circuit. Nor are any zeros employed for cancelling a pole.

DETAILED DESCRIPTION OF THE INVENTION

Figure 6:
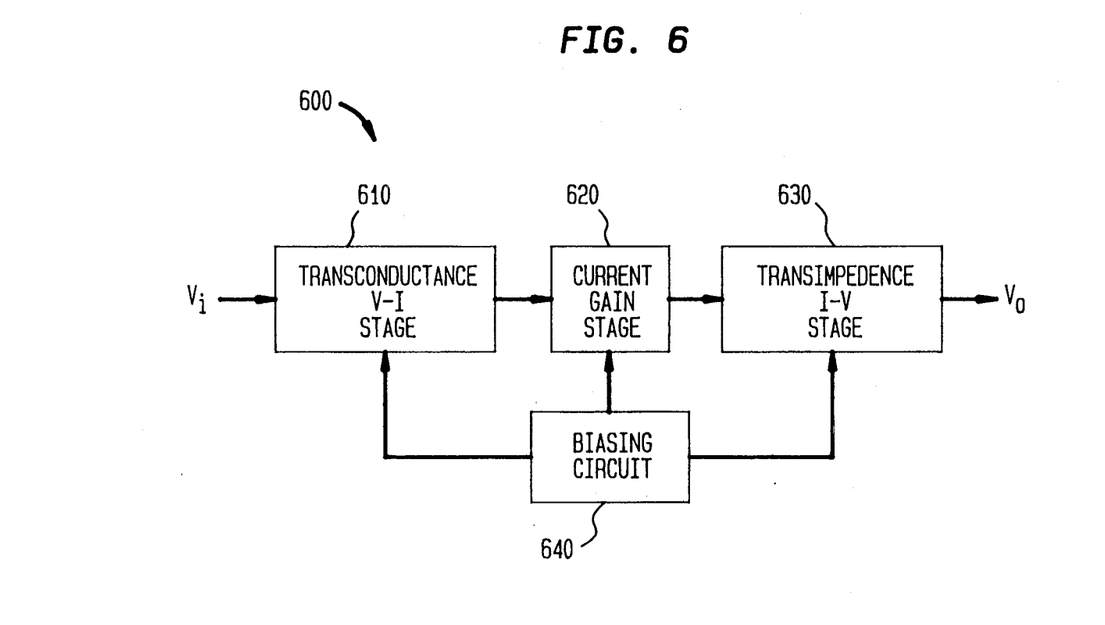
FIG. 6 depicts a block diagram of a wide-band transconductance transimpedance amplifier according to one embodiment of the present invention.

FIG. 6 depicts a functional block diagram of a transconductance, transimpedance wide-band amplifier 600 according to one embodiment of the invention. An inputted voltage signal $V_i$ is received at a transconductance stage 610. In the transconductance stage 610, the inputted voltage signal is converted to a current signal. This current signal is fed to a current gain stage 620 wherein the current signal is amplified. The amplified current signal is inputted to a transimpedance stage 630 wherein the amplified current signal is converted to a voltage signal $V_o$. This voltage signal $V_o$ is then outputted.

Illustratively, the wide-band amplifier 600 also has a d.c. biasing circuit 640. The purpose of the d.c. biasing circuit is to properly bias the active elements (i.e., transistors) contained in the transconductance, current gain and transimpedance stages 610, 620, and 630.

Preferably, the circuit 600 is implemented in CMOS/BiCMOS. CMOS provides many benefits over GaAs technology. In particular, CMOS exhibits a greater performance reliability. Furthermore, CMOS circuits are more amenable to a high level of integration (e.g., in a VLSI integrated circuit) or mixed analog and digital integration with low cost.

Figure 7:
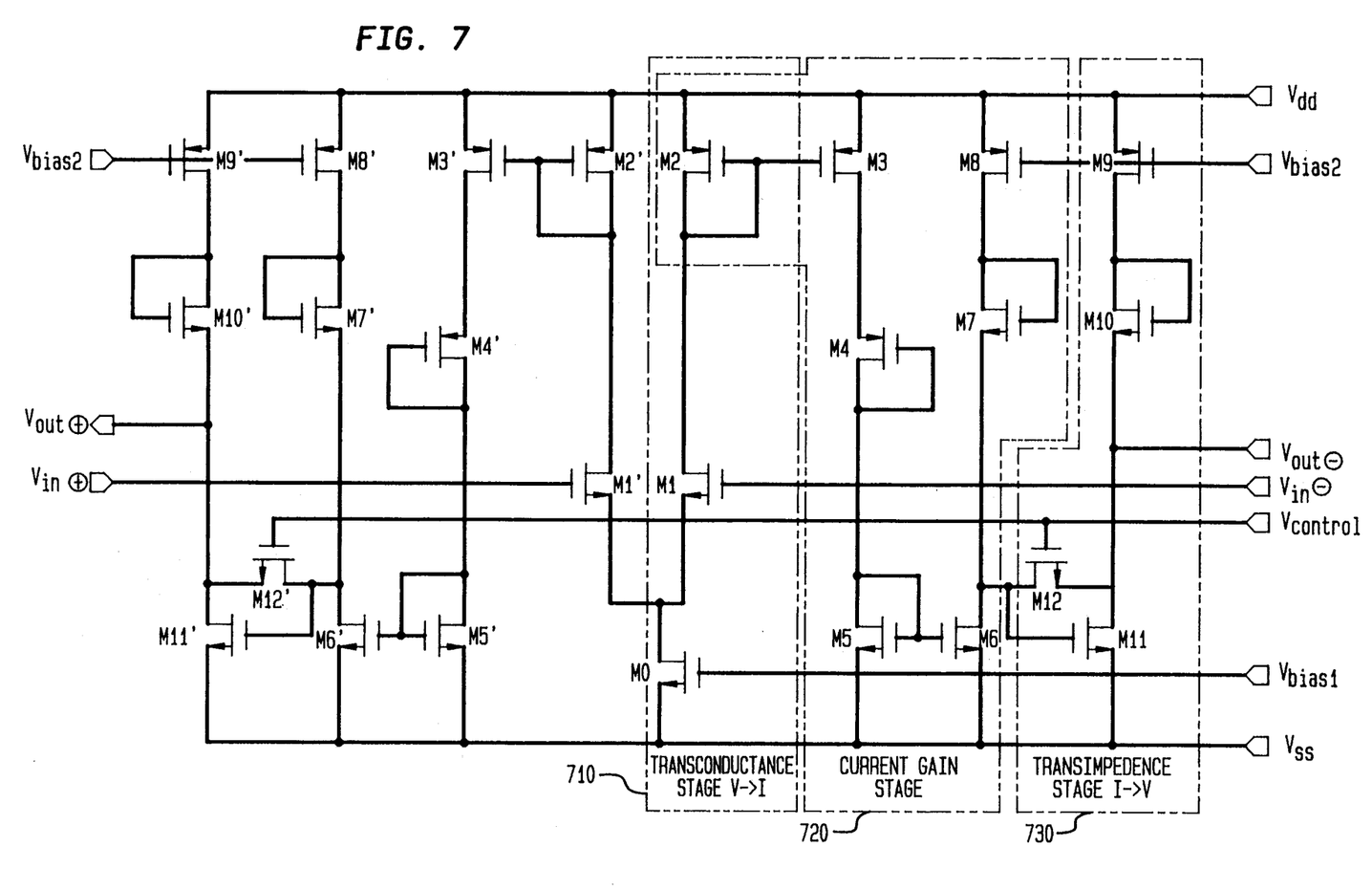
FIG. 7 depicts a CMOS/BiCMOS implementation of the amplifier shown in FIG. 6.

FIG. 7 shows a CMOS implementation 700 of the circuit 600 schematically illustrated in FIG. 6. The implementation of the wide-band amplifier 700 shown in FIG. 7 is a fully differential amplifier, i.e., each stage 710, 720 and 730 is a fully differential stage. For purposes of brevity, only one half of each stage 710, 720, and 730 is discussed below. However, because of the symmetry of the differential amplifier 700, the discussion applies analogously to both halves of each stage 710, 720, and 730.

In the circuit 700, the transistors $m_0$, $m_1$, and $m_2$ form half of the transconductance stage 710. The transistors $m_2$, $m_3$, $m_4$, $m_5$, $m_6$, $m_7$, and $m_8$ form half of the current gain stage 720. The transistors $m_9$, $m_{10}$, $m_{11}$, and $m_{12}$ form half of the transimpedance stage 730. Likewise, the transistors $m_0$, $m_1'$, $m_2'$ form a second half of the transconductance stage 710, the transistors $m_2'$–$m_8'$ form a second half of the current gain stage 720, and the transistors $m_9'$–$m_{12}'$ form a second half of the transimpedance stage 730. Note that the transistors $m_2$ and $m_2'$ are both part of the transconductance and current gain stages 710, 720.

The transconductance stage 710 includes the transistor $m_2$ which receives via its source, the voltage $V_{dd}$ from a d.c. biasing circuit (NOT SHOWN). The transistor $m_2$ is connected via its drain to the drain of the transistor $m_1$. The transistor $m_1$ is connected via its source to the drain of the transistor $m_0$ (and to the source of the transistor $m_1'$). The transistor $m_0$ receives via its source, the voltage $V_{ss}$ and via its gate, the voltage $V_{bias1}$ from a d.c. biasing circuit (NOT SHOWN). The transistor $m_0$ is for supplying a constant current to the differential connection of the transistors $m_1$ and $m_1'$. The transistor $m_1$ receives an inputted voltage signal Vin− at its gate. The transistors $m_1$ and $m_2$ form a coupled source pair which convert the inputted voltage signal Vin− to a current signal.

The current signal generated in the transconductance stage 710 is received at the gate of the transistor $m_3$. The transistor $m_3$ is connected via its gate to the drain and gate of the transistor $m_2$. The transistor $m_3$ receives the voltage $V_{dd}$ at its source from a d.c. biasing circuit (NOT SHOWN). The transistor $m_3$ is connected via its drain to the source of the transistor $m_4$. The gate of the transistor $m_4$ is connected to its drain. The drain of the transistor $m_4$ is also connected to the drain and gate of the transistor $m_5$. The source of the transistor $m_5$ receives the voltage $V_{ss}$ from a d.c. biasing circuit (NOT SHOWN).

The transistor $m_6$ is connected via its gate to the gate and drain of the transistor $m_5$ and via its drain to the source of the transistor $m_7$. The transistor $m_6$ also receives at its source the voltage $V_{ss}$ from a d.c. biasing circuit (NOT SHOWN). The gate of the transistor $m_7$ is connected to its drain and to the drain of the transistor $m_8$. The transistor $m_6$ receives the voltage $V_{dd}$ at its source and the voltage $V_{bias2}$ at its gate.

In the current gain stage 720, the transistors $m_2-m_8$ act as current gain circuits by device size ratio which current gain circuits amplify the current signal outputted from the transconductance stage 710. Transistor pairs $m_2-m_3$ and $m_5-m_6$ form current mirror circuits. The purpose of transistors $m_4$ and $m_7$ is discussed below.

In the transimpedance stage 730, the transistor $m_9$ receives the voltage $V_{dd}$ at its source and the voltage $V_{bias2}$ at its gate from a d.c. biasing circuit (NOT SHOWN). The drain of the transistor $m_9$ is connected to the drain and gate of the transistor $m_{10}$. The source of the transistor $m_{10}$ is connected to the drain of the transistor $m_{11}$. The source of the transistor $m_{11}$ receives the voltage $V_{ss}$ from a d.c. biasing circuit (NOT SHOWN). The gate of the transistor $m_{11}$ is connected to the drain of the transistor $m_6$.

In the circuit 700, a transistor $m_{12}$ is also provided. The amplified current signal from the transconductance stage 710 is received at the drain of the transistor $m_{12}$ in the transimpedance stage 730. The drain of the transistor $m_{12}$ is connected to the common connection of the drain of the transistor $m_6$ and the gate of the transistor $m_{11}$. The source of the transistor $m_{12}$ is connected to the drain of the transistor $m_{11}$. The transistor $m_{12}$ functions as a voltage controlled resistor. The resistance of the transistor $m_{12}$ can be varied by adjusting the voltage signal $V_{control}$ which is applied to the gate of the transistor $m_{12}$. It is also possible to substitute a fixed resistance resistor for the transistor $m_{12}$ (between the drain of the transistor $m_{11}$ and the common connection of the gate of the transistor $m_{11}$ and the drain of the transistor $m_6$).

The transistor $m_{12}$ forms a shunt feedback path between the gate and drain of the transistor $m_{11}$. Transistor $m_{11}$ forms the input substage (with shunt feedback) and transistor $m_9$ is an active load of the transimpedence stage 730. (The purpose of the transistor $m_{10}$ is discussed below.) In this fashion, the transistors $m_9-m_{12}$ convert the amplified current signal generated in the current gain stage 720 to a voltage signal Vout−. The voltage signal Vout− is outputted from the common connection of the source of the transistor $m_{10}$, the drain of the transistor $m_{11}$, and the source of the transistor $m_{12}$. By virtue of providing the transistor $m_{12}$ (acting as a voltage controlled resistor) it is possible to tune or adjust the gain of the amplifier 700 by adjusting the resistance in the feedback path formed by the transistor $m_{12}$.

In the circuit 700, the transistors $m_4$, $m_7$ and $m_{10}$ are each connected in a diode configuration. The purpose of these transistors is to balance the branches ($m_0$, $m_1$, $m_2$), ($m_3$, $m_4$, $m_5$), ($m_6$, $m_7$, $m_8$) so that the current mirror ratio can be matched more precisely.

In the circuit 700, the transistors $m_1-m_{12}$, $m_1'-m_{12}'$ are all signal path low impedance. All poles of the frequency responses of these transistors are at a very high frequency. Furthermore, the frequency responses of the transistors do not have any zeros.

Figure 8A:
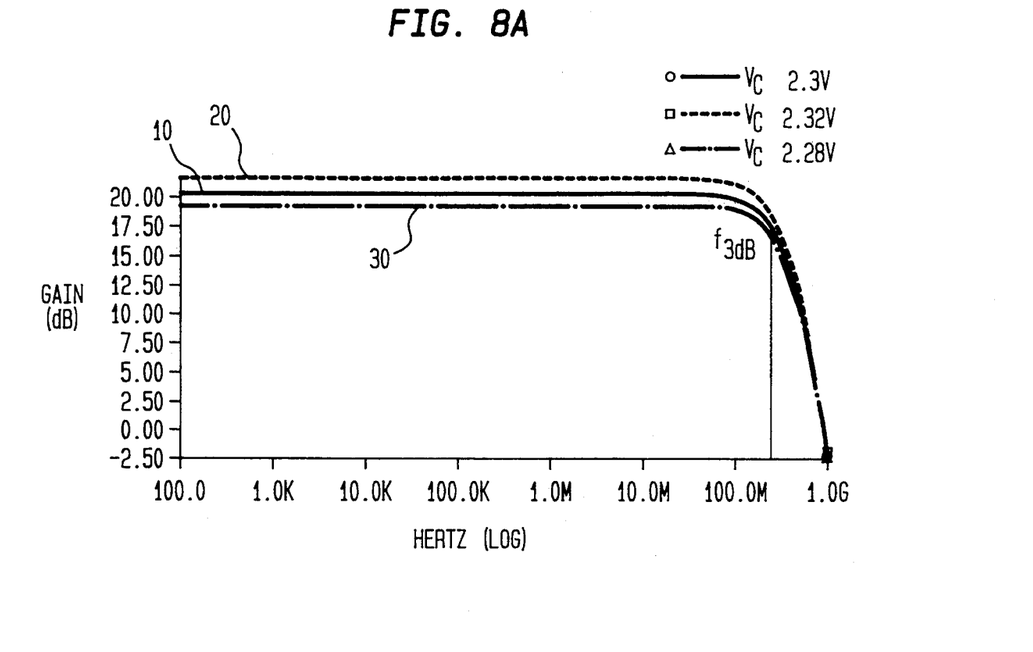
FIGS. 8a–b are gain and phase shift graphs, respectively, of the tunable wide-band amplifier shown in FIG. 7.
Figure 8B:
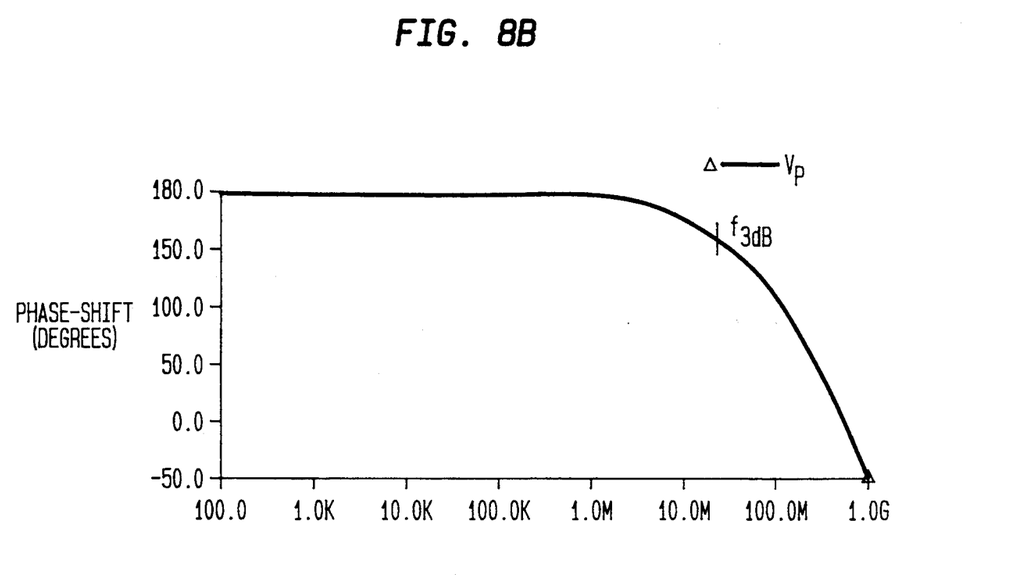

FIG. 8(a) graphically depicts the gain of the amplifier 700 as a function of frequency. As shown, a different curve 10, 20 or 30 is plotted for each of three different control voltage signals $V_{control}$ (2.3, 2.32, or 2.28 volts, respectively) applied to the variable resistance transistor $m_{12}$ (FIG. 7). FIG. 8(b) graphically depicts the phase shift of the amplifier 700 as a function of frequency. A gain of 20.3 dB can be achieved with a 3 dB upper cutoff frequency of 270 MHz. The settling time of the amplifier 700 is about 4 nsec for a 400 millivolt peak to peak output signal. An 80 MHz 400 millivolt peak to peak outputted sine wave signal experiences a phase shift of 30°.

Figure 9A:
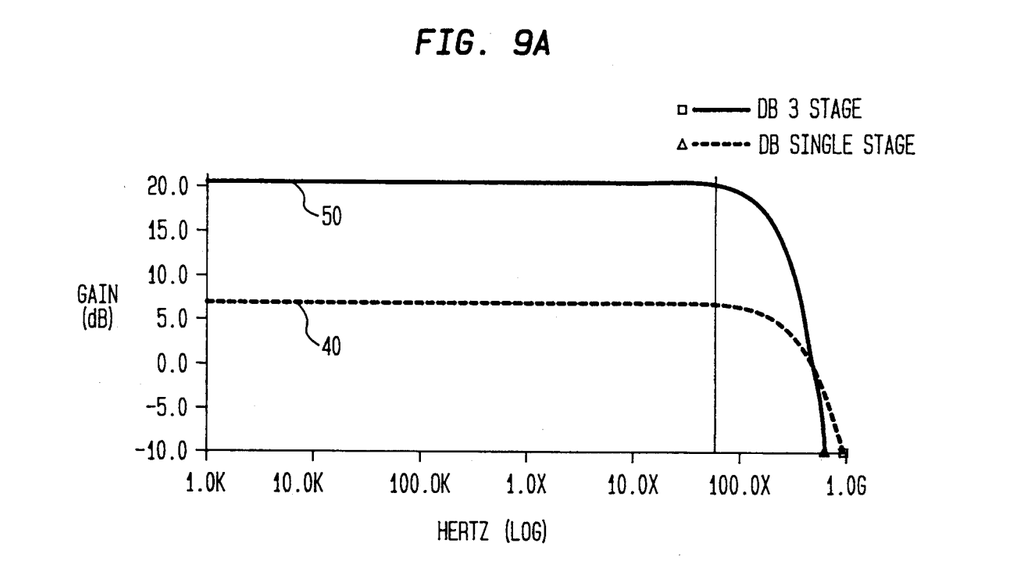
FIGS. 9a–b are gain and phase shift graphs, respectively, of a single wide-band amplifier and of three cascaded wide-band amplifiers having fixed resistances.
Figure 9B:
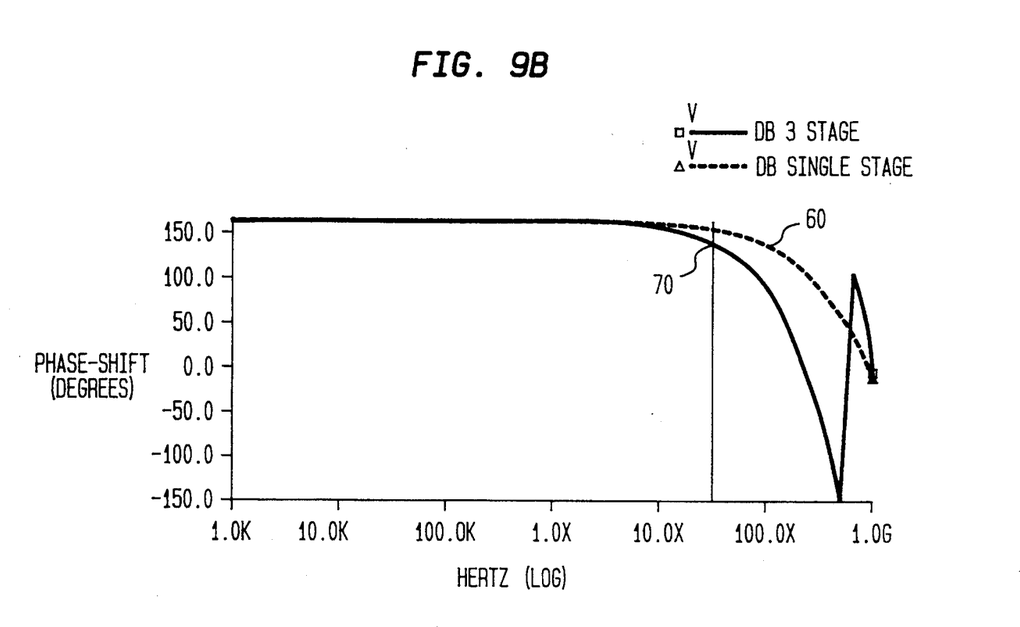

For purposes of comparison, FIGS. 9(a) and 9(b) graphically depict the gain and phase shift as a function of frequency for a circuit 700 (FIG. 7) with a fixed resistor substituted for the variable resistance transistor $m_{12}$ (FIG. 7). Two curves 40 and 50 are plotted in FIG. 9(a) and two curves 60 and 70 are plotted in FIG. 9(b). Curves 40 and 60 illustrate the response of a single amplifier 700 (FIG. 7) and curves 50 and 70 illustrate the response of three cascaded amplifiers 700 (FIG. 7). For a fixed resistor, a 400 millivolt peak to peak output signal may be generated with a settling time of 5.9 nsec. An 80 MHz 400 millivolt peak to peak outputted sine wave experiences a 65° phase shift. In the case of a single stage, a gain of 6.7 dB may be achieved with a 3 dB upper cutoff frequency of 320 MHz. Using threes cascaded stages, a 20.3 dB gain may be achieved with a 3 dB upper cutoff frequency of 175 MHz.

Figure 10:
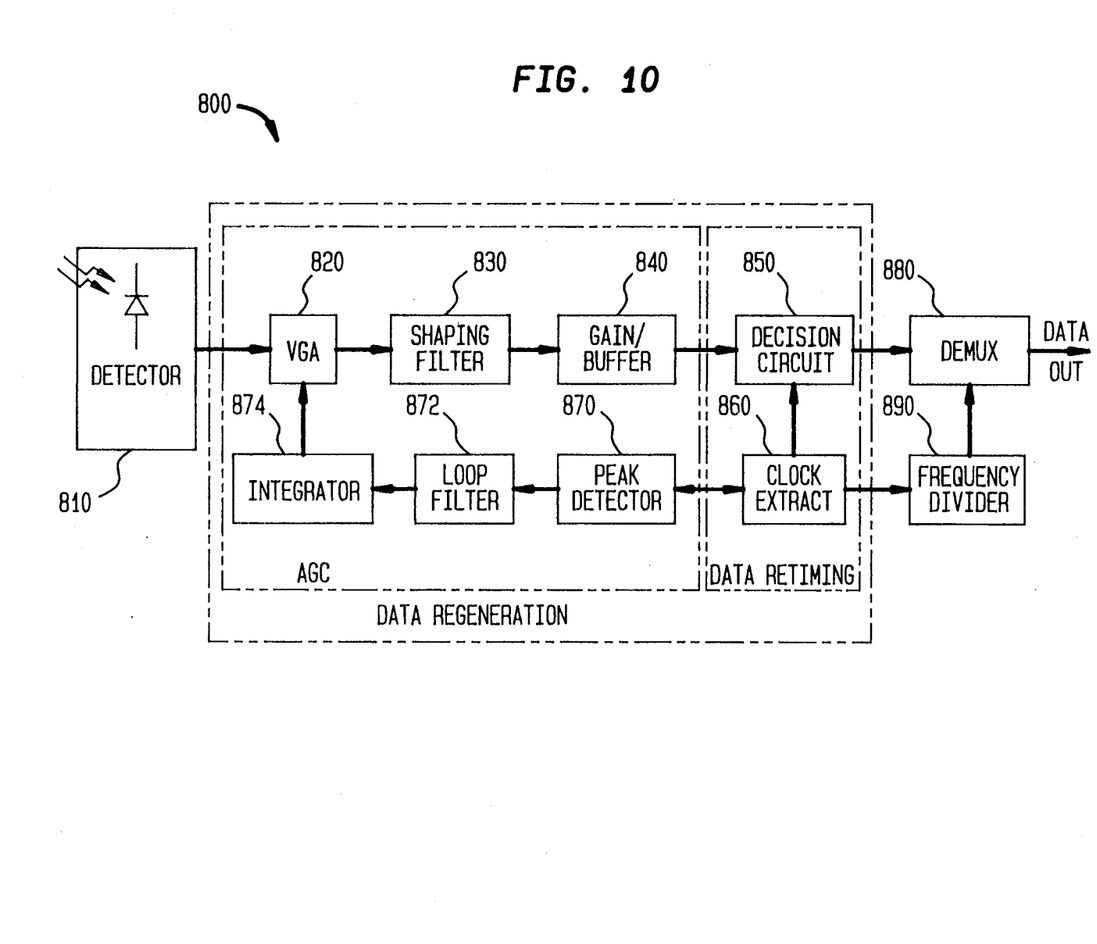
FIG. 10 is a block diagram of a receiver in an optical communications system including at least one amplifier according to the present invention.

FIG. 10 shows an illustrative application in which the wide-band amplifier 600 (FIG. 6) may be used. FIG. 10 depicts a receiver 800 for an optical communication system. For example, the optical receiver 800 may be part of an OC-3 Synchronous Optical Network (SONET) communication system. In a SONET OC-3 system, a bitstream is transmitted in the form of an optical signal from a transmitter to a receiver such as the receiver 800. The optical signal is received at a detector 810 (e.g, a pin photodiode) and converted to an electrical signal (e.g., a voltage signal). This signal is fed to a variable gain amplifier (VGA) 820 which amplifies the electrical signal. The amplified signal is then outputted to a shaping filter 830 which partially filters the noise of the signal which noise may have been generated during transmission. The shaped signal is inputted to a gain/buffer circuit 840 which amplifies the filtered signal and outputs the amplified filtered signal to a decision circuit 850. In addition, the amplified filtered signal is outputted to a clock extraction circuit 860 and a peak detector 870. The clock extraction circuit 860 recovers a bit clock from the amplified filtered signal inputted thereto (typically, the originally transmitted optical signal is a non-return to zero signal which has no clock) and outputs the recovered bit clock to the decision circuit 850. Based on the bit clock signal, the decision circuit 850 recovers the bitstream of the amplified, filtered signal. The bitstream is outputted to a demultiplexer 880 which demultiplexes individual channels from the recovered bitstream. Illustratively, the demultiplexer 880 also receivers a synchronization signal from a frequency divider 890 which divides the bitstream into channels. Illustratively, the frequency divider 890 generates the synchronization signal based on the bit clock signal outputted by the clock extraction circuit 860.

The peak detector 870 is for obtaining the peak value of the signal. The loop filter 872 receives the signal outputted by the peak detector 870 and smoothes the signal. The integrator 874 integrates the signal outputted by the loop filter 872. This integrated signal generated by the integrator 874 is fed back to the VGA 820 which accordingly adjusts the phase of the signal outputted by the detector 810 so as to maintain the synchronicity of the signal outputted by the detector 810 and the recovered bit clock generated by the clock extraction circuit 860.

In the above circuit 800, several amplifiers may be used such as in the circuits 820, 840 and 874. However, an OC-3 signal transfers data at the rate of 155.52 Mbits/sec. Thus, a wide-band amplifier with an upper cutoff frequency above 155 MHz is necessary. Advantageously, the wide-band amplifier 600 (FIG. 6) has sufficient bandwidth for use in the circuits 820, 840 and 874 yet produces little distortion.

In short, a wide-band fully differential, transconductance transimpedance amplifier with a tuneable gain is disclosed. The wide-band amplifier receives an inputted voltage signal at a transconductance stage. The transconductance stage generates a current signal from the inputted voltage signal. This generated current signal is fed to a current gain stage wherein the current signal is amplified. The amplified current signal is then fed to a transimpedance stage which converts the amplified current signal to an output voltage signal. The inventive wide-band amplifier may be implemented in CMOS/BiCMOS which is amenable to a high level of integration, including the integration of mixed analog and digital devices.

Finally, the invention has been described above with reference to specific embodiments. However, this was merely illustrative. Numerous other embodiments may be devised by those having ordinary skill in the art without departing from the spirit and scope of the following claims.

We claim:

1. A wide-band amplifier comprising:
   a transconductance stage for generating a current signal from an inputted voltage signal, said transconductace stage having a low output impedance,
   a current gain stage connected to said transconductance stage for amplifying said current signal generated by said transconductance stage, said current gain stage having a high frequency response, and
   a transimpedance stage connected to said current gain stage for generating an output voltage signal from said amplified current signal generated by said current gain stage, wherein said transconductance stage comprises a diode connected transistor, which provides said low output impedance for said transconductance stage.

2. The amplifier of claim 1 wherein each of said transconductance, current gain and transimpedance stages comprises transistors, said transistors being only CMOS and BiCMOS type transistors.

3. The amplifier of claim 1 wherein said transconductance stage is a differential transconductance stage, wherein said current gain stage is a differential current gain stage and wherein said transimpedance stage is a differential transimpedance stage.

4. The amplifier of claim 1 wherein the gain of said amplifier is adjustable.

5. A wide-band amplifier comprising:
   a transconductance stage for generating a current signal from an inputted voltage signal,
   a current gain stage connected to said transconductance stage for amplifying said current signal generated by said transconductance stage,
   a transimpedance stage connected to said current gain stage for generating an output voltage signal from said amplified current signal generated by said current gain stage, and wherein
   said amplifier has an adjustable gain, and
   said transimpedance stage comprises a transistor connected in a shunt feedback path of said current gain stage, said transistor receiving a control signal for varying a resistance therein so as to adjust said amplifier gain.

6. The amplifier of claim 1 wherein said transconductance stage comprises at least two transistors connected as a source coupled pair.

7. The amplifier of claim 1 wherein said current gain stage comprises at least one current mirror circuit.

8. The amplifier of claim 1 wherein said transimpedance stage comprises a shunt feedback circuit.

9. The amplifier of claim 1 wherein the gain of said amplifier is fixed.

10. The amplifier of claim 1 wherein the response of said amplifier is free of zeros.

11. The amplifier of claim 1 wherein each of said transconductance, current gain and transimpedance stages only comprises transistors which are signal path low impedance.

12. A wide-band fully differential amplifier comprising:
   a differential transconductance stage comprising transistors for generating a current signal from an inputted voltage signal, said differential transconductance stage having a low output impedance,
   a differential current gain stage comprising transistors for amplifying said current signal generated by said differential transconductance stage, said differential current gain stage having a high frequency response, and
   a differential transimpedance stage comprising transistors for generating an output voltage signal from said amplified current signal generated by said transconductance current gain stage,
   wherein said differential transconductance stage comprises a diode connected transistor, which provides said low output impedance for said differential transconductance stage.

13. A VLSI integrated circuit comprising at least one wide-band amplifier which at least one wide-band amplifier comprises:
   a transconductance stage for generating a current signal from a voltage signal inputted thereto, said transconductance stage having a low output impedance, a current gain stage connected to said transconductance stage for amplifying said current signal generated by said transconductance stage, said current gain stage having a high frequency response, and a transimpedance stage connected to said current gain stage for generating an output voltage from said amplified current signal generated by said current gain stage, wherein said transconductance stage comprises a diode connected transistor, which provides said low output impedance for said transconductance stage.

14. A receiver in a communications system comprising at least one wide-band amplifier which at least one wide-band amplifier comprises:

a transconductance stage for generating a current signal from a voltage signal inputted thereto, said transconductance stage having a low output impedance, a current gain stage for amplifying said current signal generated by said transconductance stage, said current gain stage having a high frequency response, and a transimpedance stage for generating an output voltage from said amplified current signal generated by said current gain stage, wherein said transconductance stage comprises a diode connected transistor, which provides said low output impedance for said transconductance stage.

15. The receiver of claim 14 wherein said communications system is an optical communications system.

* * * * *